(12) United States Patent
Long et al.

(10) Patent No.: US 11,116,105 B2
(45) Date of Patent: Sep. 7, 2021

(54) LIQUID-COOLING TERMINATION STRUCTURE HAVING TEMPERATURE SENSING FUNCTION

(71) Applicants: Shanghai LuYao Energy Technology Co., Ltd., Shanghai (CN); Ling Long, Shanghai (CN); Li Liu, Shanghai (CN); Tong-hu Xia, Shanghai (CN)

(72) Inventors: Ling Long, Shanghai (CN); Li Liu, Shanghai (CN); Tong-hu Xia, Shanghai (CN)

(73) Assignees: SHANGHAI LUYAO ENERGY TECHNOLOGY CO., LTD., Shanghai (CN); Ling Long, Shanghai (CN); Li Liu, Shanghai (CN); Tong-Hu Xia, Shanghai (CN)

(*) Notice: Subject to any disclaimer, the term of this patent is extended or adjusted under 35 U.S.C. 154(b) by 22 days.

(21) Appl. No.: 16/432,756

(22) Filed: Jun. 5, 2019

(65) Prior Publication Data
US 2019/0289747 A1 Sep. 19, 2019

Related U.S. Application Data

(62) Division of application No. 15/693,058, filed on Aug. 31, 2017, now abandoned.

(51) Int. Cl.
*H05K 7/20* (2006.01)
*G01K 1/14* (2021.01)
(Continued)

(52) U.S. Cl.
CPC ........... *H05K 7/20218* (2013.01); *G01K 1/14* (2013.01); *H01L 23/34* (2013.01); *H01L 23/473* (2013.01);
(Continued)

(58) Field of Classification Search
CPC .. H05K 7/20218; H05K 7/20763; G01K 1/14; H01L 23/34; H01L 23/473; B23Q 11/141
(Continued)

(56) References Cited

U.S. PATENT DOCUMENTS

| 4,830,515 A | * | 5/1989 | Cortes | ...................... G01K 1/14 136/221 |
| 2002/0085617 A1 | * | 7/2002 | Gul | .......................... G01K 1/14 374/208 |

(Continued)

*Primary Examiner* — Joel M Attey
(74) *Attorney, Agent, or Firm* — Chun-Ming Shih; HDLS IPR Services

(57) ABSTRACT

A liquid-cooling termination structure having temperature sensing function is disposed on a liquid-cooling system which is used for performing a heat dissipating operation to a heat source of equipment. The liquid-cooling termination structure includes a water cooling head and a temperature sensing unit. The water cooling head is formed with an adhering surface used for being adhered on the heat source. The temperature sensing unit includes a sensing terminal, and a signal transferring cable extended from the sensing terminal. The sensing terminal is combined with the water cooling head from the exterior of the water cooling head, and the signal transferring cable is connected to the equipment for obtaining the temperature of the heat source through the water cooling head.

1 Claim, 8 Drawing Sheets

(51) Int. Cl.
*H01L 23/34* (2006.01)
*H01L 23/473* (2006.01)
*B23Q 11/14* (2006.01)

(52) U.S. Cl.
CPC ........ *H05K 7/20763* (2013.01); *B23Q 11/141* (2013.01)

(58) Field of Classification Search
USPC ........................................................ 165/11.1
See application file for complete search history.

(56) References Cited

U.S. PATENT DOCUMENTS

2013/0208421 A1* 8/2013 Chester .............. H05K 7/20763
                                                                                        361/699
2017/0211989 A1* 7/2017 Sozzi .................... G01M 17/10

* cited by examiner

LIQUID-COOLING TERMINATION STRUCTURE HAVING TEMPERATURE SENSING FUNCTION

CROSS-REFERENCE TO RELATED APPLICATION

This application is a divisional application of U.S. patent application Ser. No. 15/693,058, filed on Aug. 31, 2017, and entitled "LIQUID-COOLING TERMINATION STRUCTURE HAVING TEMPERATURE SENSING FUNCTION". The entire disclosures of the above application are all incorporated herein by reference.

BACKGROUND OF THE INVENTION

Field of the Invention

The present invention relates to a liquid-cooling system, especially to a liquid-cooling termination structure having temperature sensing function.

Description of Related Art

For monitoring the operating condition of a heat source, such as a central processing unit (CPU), and preventing overheating which may cause malfunction, a liquid-cooling system applied in an equipment, such as a cellphone or a computer, is disposed with a temperature sensor on the above-mentioned heat source, so that the temperature of the heat source is able to be obtained through the temperature sensor, and the operating condition of the heat source can be monitored and other data can also be obtained.

However, the means of disposing the temperature sensor on the heat source for obtaining the temperature thereof requires the heat source to provide a function of outputting a temperature signal, thus a concern of leaking information may be caused, and the information security is unable to be comprehensively protected.

Accordingly, the applicant of the present invention has devoted himself for improving the mentioned disadvantages.

SUMMARY OF THE INVENTION

The present invention is to provide a liquid-cooling termination structure having temperature sensing function, in which a liquid-cooling termination is integrated with a temperature sensor, so that the temperature of a heat source can be obtained through the liquid-cooling termination being in contact with the heat source, in other words the heat source is not required to provide a function of outputting a temperature signal, so that the information security of an equipment can be effectively protected.

Accordingly, the present invention provides a liquid-cooling termination structure having temperature sensing function, which is disposed on a liquid-cooling system used for performing a heat dissipating operation to a heat source of equipment. The liquid-cooling termination structure includes a water cooling head and a temperature sensing unit. The water cooling head is formed with an adhering surface used for being adhered on the heat source. The temperature sensing unit includes a sensing terminal, and a signal transferring cable extended from the sensing terminal. The sensing terminal is combined with the water cooling head from the exterior of the water cooling head, and the signal transferring cable is connected to the equipment for obtaining the temperature of the heat source through the water cooling head.

DETAILED DESCRIPTION OF THE INVENTION

Preferred embodiments of the present invention will be described with reference to the drawings.

Figure 1:
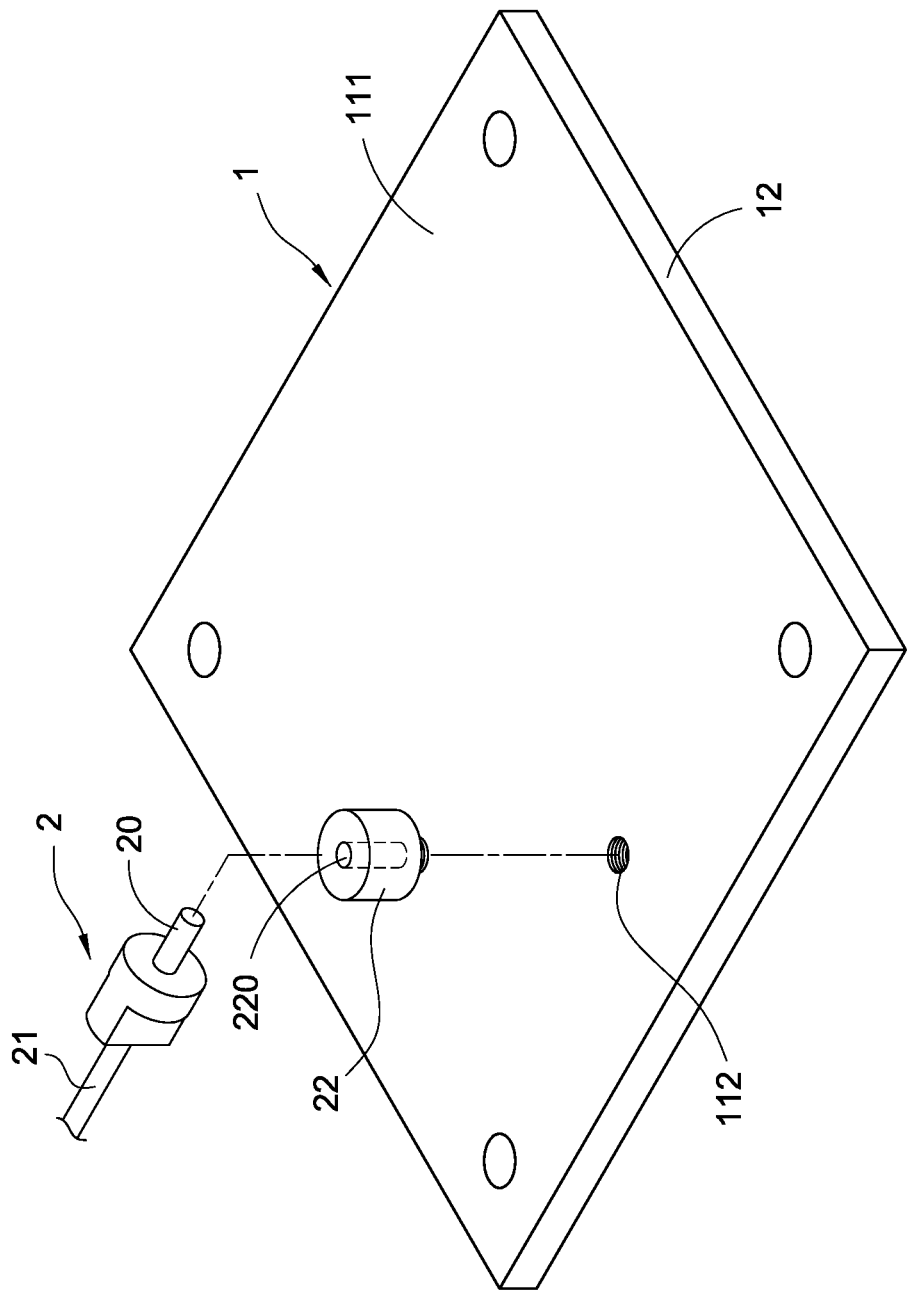
FIG. 1 is a perspective exploded view according to a first embodiment of the present invention.
Figure 2:
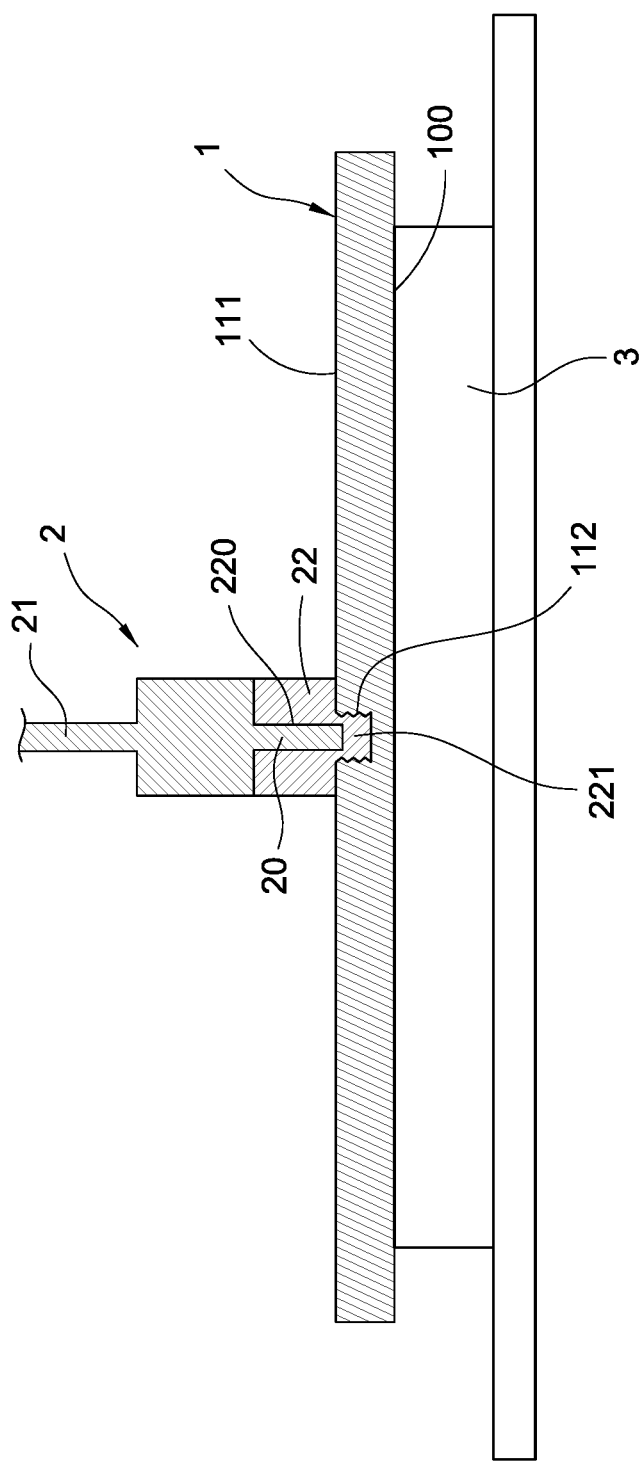
FIG. 2 is a cross sectional view showing the assembly according to the first embodiment of the present invention.

Please refer to FIG. 1 and FIG. 2, wherein FIG. 1 is a perspective exploded view according to a first embodiment of the present invention and FIG. 2 is a cross sectional view showing the assembly according to the first embodiment of the present invention. The present invention provides a liquid-cooling termination structure having temperature sensing function. The liquid-cooling termination structure is disposed on a liquid-cooling system (not shown in figures), and the above-mentioned liquid-cooling system is used for dissipating a heat source of an equipment such as a cellphone or a computer, or used for working with an equipment such as a large-scale server, a medical equipment, a precision instrument or an electric-powered device for providing a heat dissipation effect. The above-mentioned heat source can be a central processing unit (CPU) or other electric components capable of generating heat which are disposed inside the cellphone or the computer. The liquid-cooling termination structure includes a water cooling head 1 and a temperature sensing unit 2.

The water cooling head 1 is formed as a polygonal sheet-like member made of a thermal conductive material, and the above-mentioned thermal conductive material can be copper or aluminum. The water cooling head 1 is formed with at least one adhering surface 100, so that the adhering surface 100 is able to be adhered on the above-mentioned heat source 3 (as shown in FIG. 2), thereby allowing the liquid-cooling system to perform a heat dissipating operation to the heat source 3. According to this embodiment, the water cooling head 1 is further formed with a top surface 111 arranged opposite to the adhering surface 100, and lateral surfaces 12 continuously surrounding peripheries of the adhering surface 100 and the top surface 111, so as to form the above-mentioned sheet-like member.

The temperature sensing unit 2 can be a contacting-type or infrared sensor, and the interior thereof is mainly composed of a thermal couple or a thermistor. The temperature sensing unit 2 includes a sensing terminal 20, and a signal transferring cable 21 extended from the rear end of the sensing terminal 20, and the signal transferring cable 21 is connected to the above-mentioned cellphone or the computer. According to this embodiment, the temperature sensing terminal 20 is formed as an elongated rod-like member, and screwed on the water cooling head 1 by utilizing a screw piece 221. Wherein, the top surface 111 of the water cooling head 1 is formed with a screw hole 112, two ends of the screw piece 22 are respectively formed with a package hole 220 and a screw rod 221, the package hole 220 allows the sensing terminal 20 to be packaged therein, the screw rod 221 is screwed in the screw hole 112 of the water cooling head 1, so that the sensing terminal 20 is combined with the water cooling head 1. Accordingly, when thermal energy is generated by the heat source 3, the thermal energy can be transferred to the water cooling head 1 adjacently adhered with the heat source 3, and the sensing terminal 20 can be served to sense the water cooling head 1 for obtaining the temperature of the heat source 3.

Figure 3:
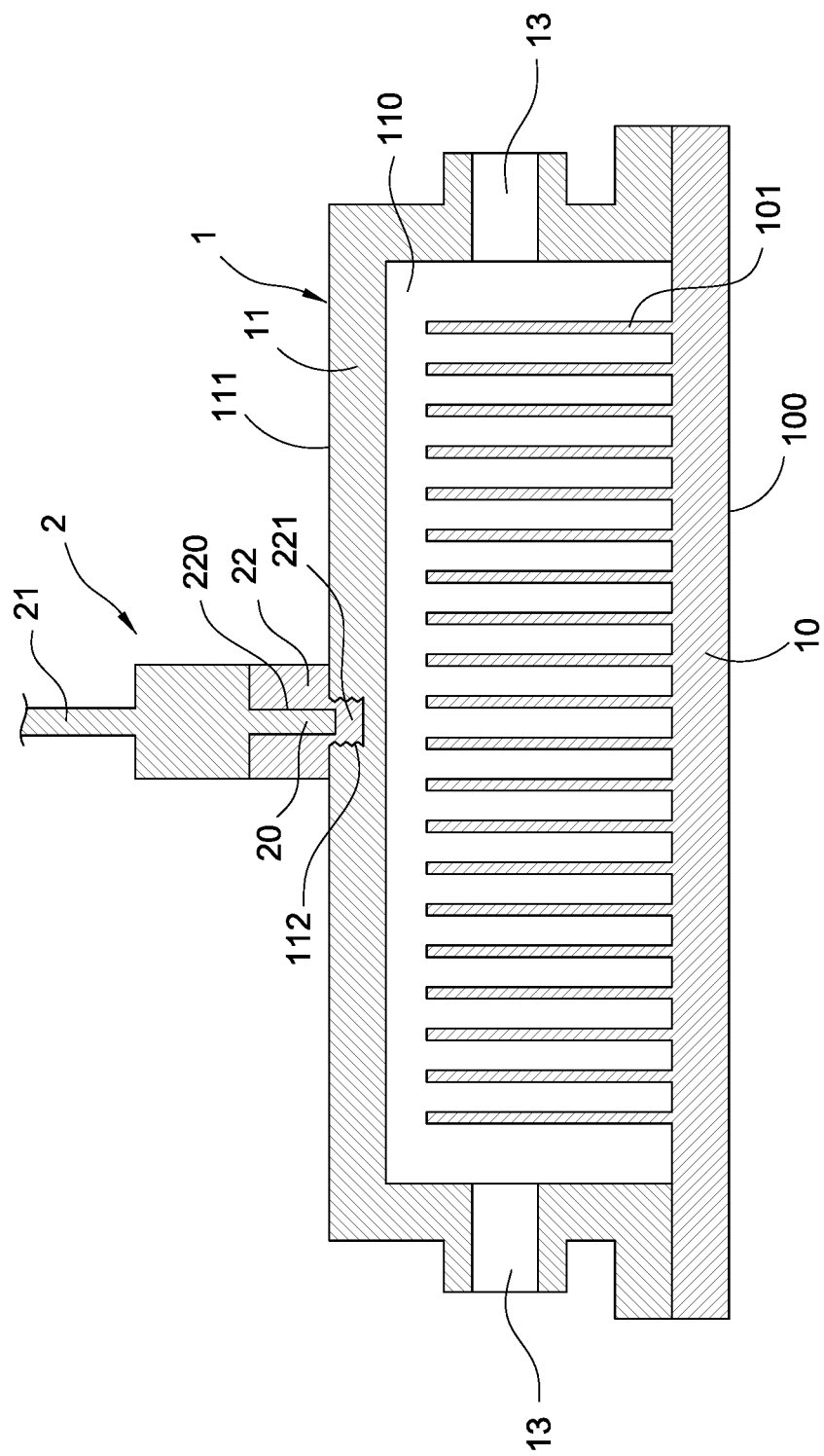
FIG. 3 is a cross sectional view showing the assembly according to a second embodiment of the present invention.

Please refer to FIG. 3, according to a second embodiment provided by the present invention, the water cooling head 1 further includes a bottom plate 10, and a cover plate 11 covered on the bottom plate 10. The adhering surface 100 is formed below the bottom plate 10, and the top surface 111 is formed above the cover plate 11. An accommodation chamber 110 is formed between the cover plate 11 and the bottom plate 10, the bottom plate 10 is formed with a plurality of fins 101 arranged with intervals and disposed in the accommodation chamber 110, and the cover plate 11 is disposed with two water connecting ports 13 communicated with the accommodation chamber 110, thereby allowing the above-mentioned liquid-cooling system to be connected. According to the FIG. 1 and FIG. 2 disclosed in the first embodiment, the temperature sensing unit 2 is screwed on the cover plate 11 through the screw piece 22, in other words the above-mentioned screw hole 112 is formed on the top surface 111 of the cover plate 11, and the screw rod 221 of the screw piece 22 is screwed in the screw hole 112 of the cover plate 11.

Figure 4:
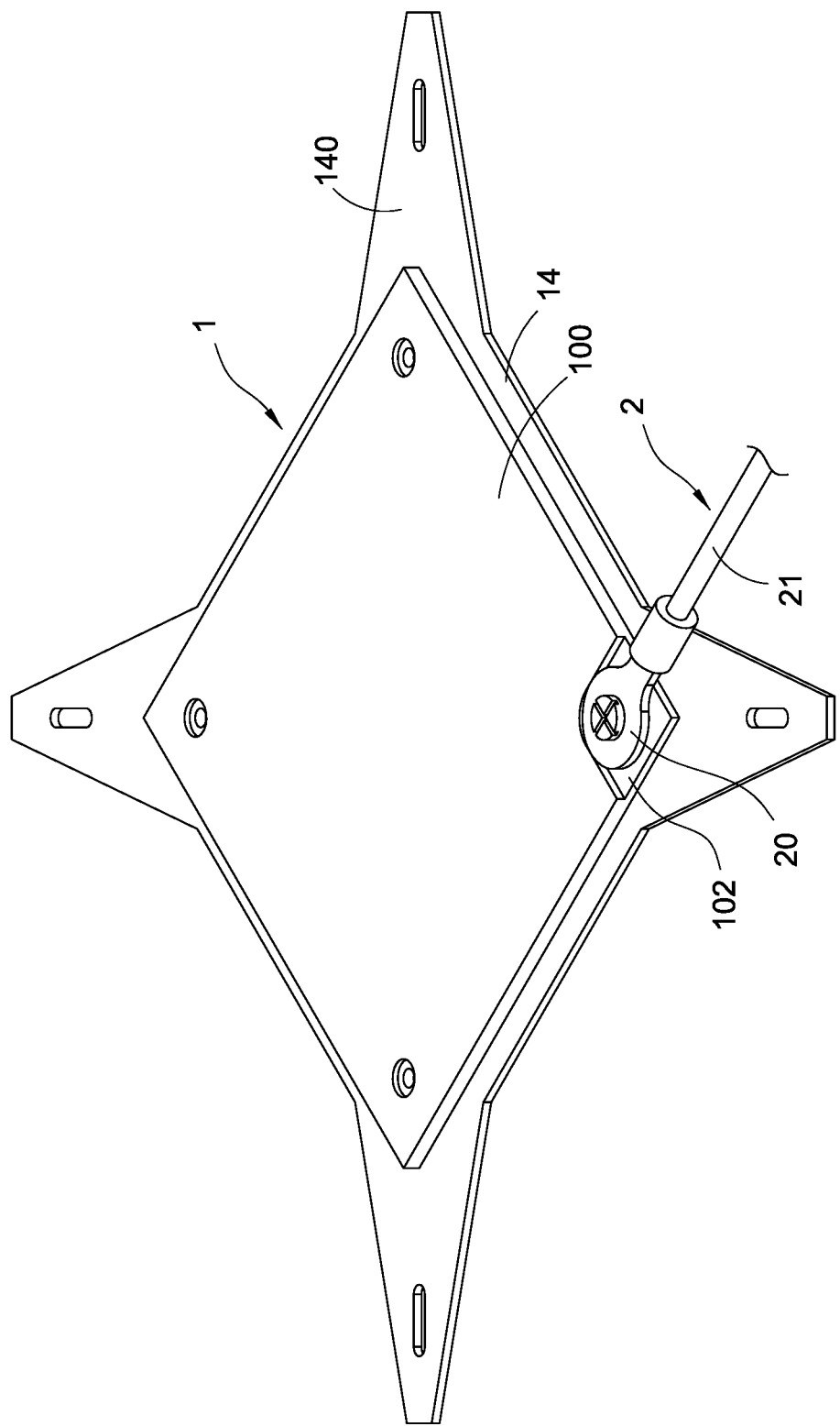
FIG. 4 is a perspective view showing the assembly according to a third embodiment of the present invention.
Figure 5:
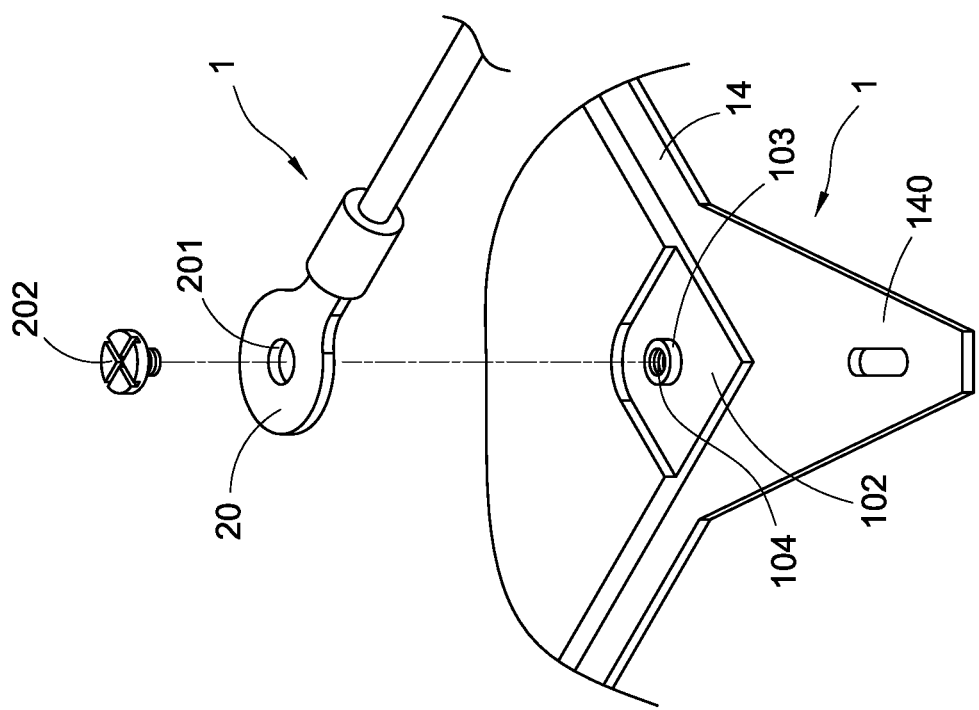
FIG. 5 is a partial exploded view according to the third embodiment of the present invention.

Please refer to FIG. 4 and FIG. 5, according to a third embodiment provided by the present invention, a recessed surface 102 is formed at a corner of the adhering surface 100 of the water cooling head 1, and a positioning post 103 is formed on the recessed surface 102. The sensing terminal 20 of the temperature sensing unit 2 is formed as a flat circular member having a positioning hole 201, the sensing terminal 20 is sleeved on the positioning post 103 through the positioning hole 201, so that the sensing terminal 20 can be combined on the recessed surface 102 with a riveting or soldering means; according to this embodiment, a screw hole 104 is formed in the positioning post 103, and a screwing member 202 is utilized for being screwed in the screw hole 104 so as to be fastened. Moreover, a stand 14 is stacked on the top surface 11 of the water cooling head 1, the stand 14 has extending feet 140 corresponding to corners of the water cooling head 1, so that the extending feet 140 are able to work with a circuit board (not shown in figures) of the heat source 3 for allowing the water cooling head 1 to be fastened with the heat source 3.

Figure 6:
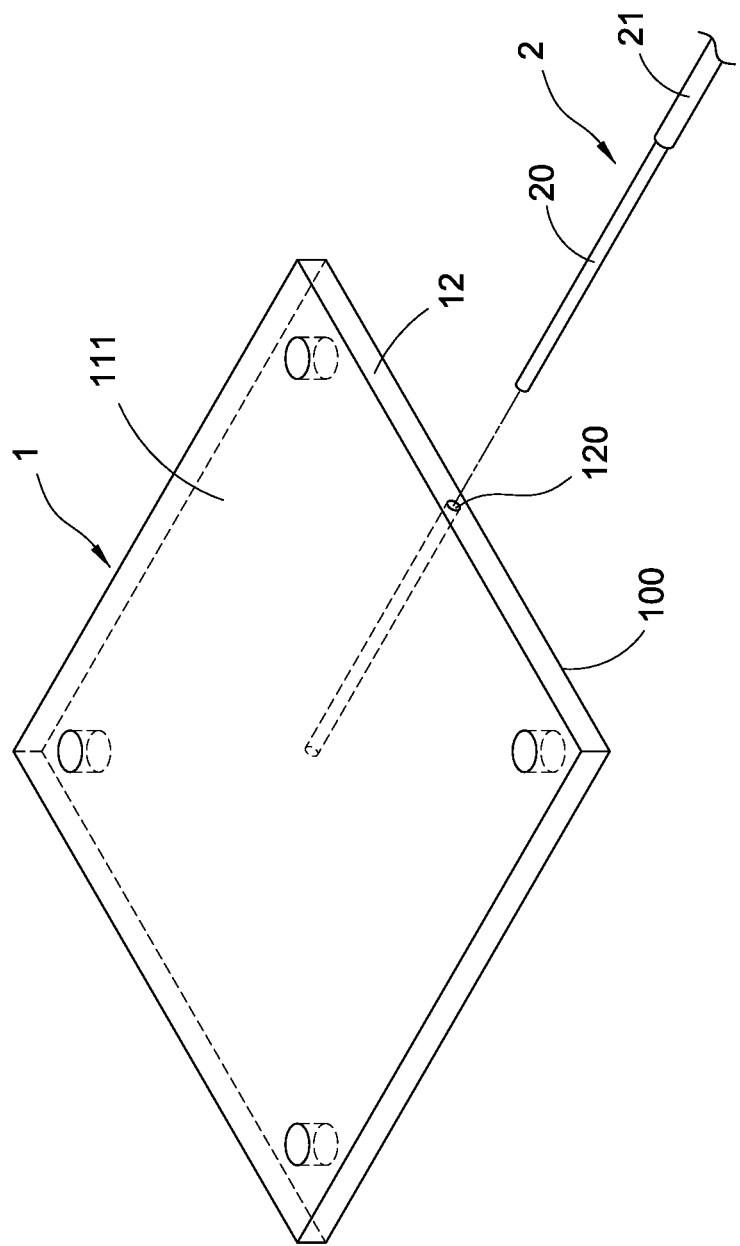
FIG. 6 is a perspective exploded view according to a fourth embodiment of the present invention.
Figure 7:
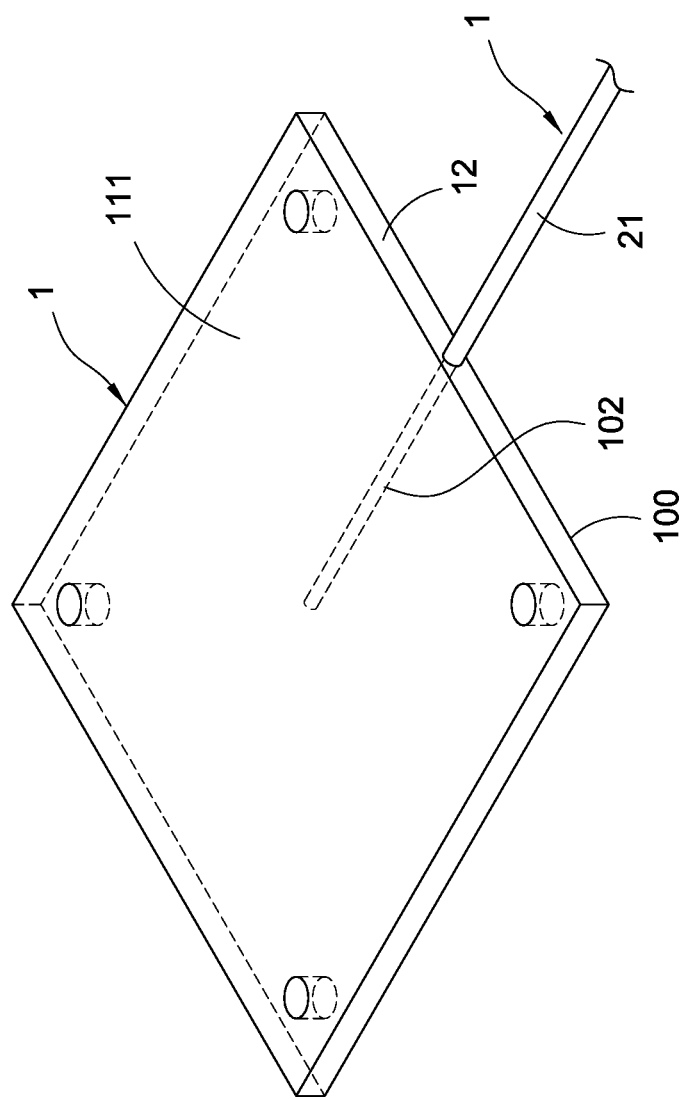
FIG. 7 is a perspective view showing the assembly according to the fourth embodiment of the present invention.
Figure 8:
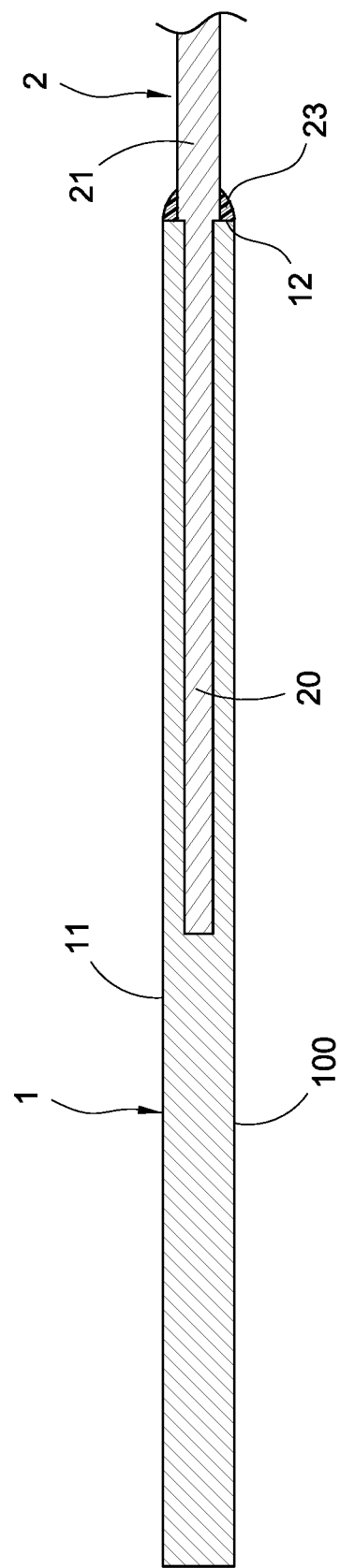
FIG. 8 is a cross sectional view showing the assembly according to a fifth embodiment of the present invention.

Please refer to FIG. 6 and FIG. 7, according to a fourth embodiment provided by the present invention, the sensing terminal 20 of the temperature sensing unit 2 is formed in a needle-like status, and inserted to the interior from the lateral surface 12 of the water cooling head 1. Details are provided as follows, the lateral surface 12 of the water cooling head 1 is formed with an orifice 120, and the orifice 120 allows the sensing terminal 20 in the needle-like status to be tightly inserted therein so as to be packaged in the water cooling head 1; moreover, please refer to FIG. 8, an outer edge of the orifice 120 is further processed with a soldering operation for forming a sealed portion 23, so that the sensing terminal 20 can also be packaged in the water cooling head 1.

Accordingly, with the above-mentioned components, the liquid-cooling termination structure having temperature sensing function is assembled.

Based on what has been disclosed above, the liquid-cooling termination structure having temperature sensing function provided by the present invention enables the temperature sensing unit 2 and the water cooling head 1 to be integrated with the liquid-cooling termination being combined, so that the temperature of the heat source 3 can be obtained through the water cooling head 1 being in contact with the heat source 3. As such, the heat source 3 is not required to provide a function of outputting a temperature signal, so that the information security of the cellphone or the computer can be ensured, and the concern of leaking information can be avoided.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A liquid-cooling termination structure having temperature sensing function, disposed on a liquid-cooling system used for performing a heat dissipating operation to a heat source of equipment, and including:
    a water cooling head, disposed outside the heat source of equipment, having an adhering surface adhered to the heat source of equipment; and
    a temperature sensing unit, including a sensing terminal, and a signal transferring cable extended from the sensing terminal, wherein the sensing terminal is combined with the water cooling head from the exterior of the water cooling head, and the signal transferring cable is connected to the equipment for obtaining the temperature of the heat source through the water cooling head;
    wherein the water cooling head is further formed with a top surface arranged opposite to the adhering surface, and a lateral surface continuously surrounding peripheries of the adhering surface and the top surface, the top surface is formed with a screw hole, and the sensing terminal is screwed in the screw hole by utilizing a screw piece;
    wherein the screw hole does not penetrate through the water cooling head;
    wherein two ends of the screw piece are formed with a package hole and a screw rod,
    the package hole allows the sensing terminal to be packaged therein, and the screw rod is screwed in the screw hole of the top surface; and
    wherein the sensing terminal does not protrude out of a bottom surface of the screw rod.

\* \* \* \* \*